United States Patent [19]

Paschen

[11] 4,355,422
[45] Oct. 19, 1982

[54] TUNABLE RADIO RECEIVER WITH DETUNING PREVENTION DUE TO POWER SUPPLY VARIATIONS

[75] Inventor: Hans-Joachim Paschen, Remchingen, Fed. Rep. of Germany

[73] Assignee: International Standard Electric Corporation, New York, N.Y.

[21] Appl. No.: 240,631

[22] Filed: Mar. 4, 1981

[30] Foreign Application Priority Data

Mar. 13, 1980 [DE] Fed. Rep. of Germany ....... 3009652

[51] Int. Cl.³ .............................................. H04B 1/16
[52] U.S. Cl. .................................... 455/343; 307/30; 307/296 R; 330/140; 455/150; 455/298; 455/310
[58] Field of Search ............... 455/117, 217, 298, 230, 455/310, 312, 343, 150; 179/1 A; 330/135, 140, 305; 323/266, 299, 354; 307/30, 33, 35, 296 R; 358/190

[56] References Cited

U.S. PATENT DOCUMENTS

| | | | |
|---|---|---|---|
| 2,179,260 | 11/1939 | Jones | 455/310 |
| 2,812,393 | 11/1957 | Patrick | 307/296 R |
| 3,059,109 | 10/1962 | Silberbach | 455/298 |
| 3,065,424 | 11/1962 | Whisenhunt | 455/343 |
| 3,181,066 | 4/1965 | Ebbinge et al. | 455/343 |

Primary Examiner—Marc E. Bookbinder
Attorney, Agent, or Firm—John T. O'Halloran

[57] ABSTRACT

In a varactor diode tunable receiver supplied with operating current from batteries, the invention proposes to insert a blocking diode between the supply terminal of the playback amplifier and the input of the stabilizing circuit producing a stabilized tuning supply voltage for the varactor diodes, and to arrange a storage capacitor of suitable capacity in parallel with the input of the stabilizing circuit. This measure prevents the receiver from becoming detuned during voltage changes on the battery caused by the high modulation peaks of the playback amplifier. The battery can be used until the intended point of complete discharge is reached, without any considerable detunings of the receiver having to be feared.

2 Claims, 2 Drawing Figures

TUNABLE RADIO RECEIVER WITH DETUNING PREVENTION DUE TO POWER SUPPLY VARIATIONS

BRIEF DESCRIPTION OF PRIOR ART

The varactor diodes used for the tuning of radio receivers, require a high stability of the tuning supply voltage which is used for supplying the varactor diodes used as tuning elements. Otherwise it is to be feared that owing to temperature variations or voltage variations of the D.C. supply source of the receiver, the oscillating circuits and filters containing the varactor diodes are caused to be detuned, thus either disturbing or even preventing the reproduction of the selected programme.

In the case of a portable radio receiver known, for example, from the technical journal "Funk-Technik" 1973, No. 10, pp. 349 to 351, which is capable of being operated from the mains as well as from batteries, the reproduction amplifier, when battery-operated, for controlling the loudspeakers of the receiver, and the stabilizing circuit for generating the stabilized tuning supply voltage for the varactor diodes of the tuner of the receiver, are connected, for the supply purpose, directly to the battery. In this way variations of the battery voltage which are due to the discharge of the battery after having been in use for a longer period of time, or any other influences of the receiver upon the battery, are not transferred to the tuning supply voltage for the varactor diodes as long as they do not fall short of a predetermined voltage value of the battery. The playback (reproduction) amplifier which, as a rule, is designed as a power amplifier having a large range of modulation, picks from the battery a supply current depending on the degree of modulation. In the case of high modulation peaks, this operating current may cause a voltage drop across the internal resistance of the battery, i.e. in such a way that the voltage change at the battery, during the modulation peaks, will cause the voltage at the output of the battery, to drop substantially below the voltage value which is still admissible as an input voltage for the stabilizing circuit. In this particular case, during the modulation peak, also the output voltage of the stabilizing circuit drops off, and causes the varactor diode circuits to be detuned.

OBJECTS OF THE INVENTION

It is the object of the invention to provide measures to be taken in the case of a tunable receiver for preventing the tuning supply voltage supplying the varactor diodes from dropping off to such an extent owing to the momentary high loading in the case of modulation peaks of the playback amplifier, that detunings are likely to result therefrom.

With respect to a tunable receiver of the type mentioned hereinbefore, this object is achieved by the technical features set forth in the characterizing part of claim 1. This solution in particular offers the advantage that it is capable of being performed with the aid of simple technical means and has no additional loading effect upon the battery. Moreover, if so required, it may be subsequently applied to any receiver of this type by simply being inserted therein.

In an advantageous further embodiment of the invention, a protective resistor prevents the blocking diode from being overloaded and damaged during recharging of the discharged capacitor.

BRIEF DESCRIPTION OF DRAWINGS

In the following the invention will now be explained in greater detail with reference to an advantageous example of embodiment shown in FIGS. 1 and 2 of the accompanying drawings, in which.

DETAILED DESCRIPTION OF INVENTION

Figure 1:
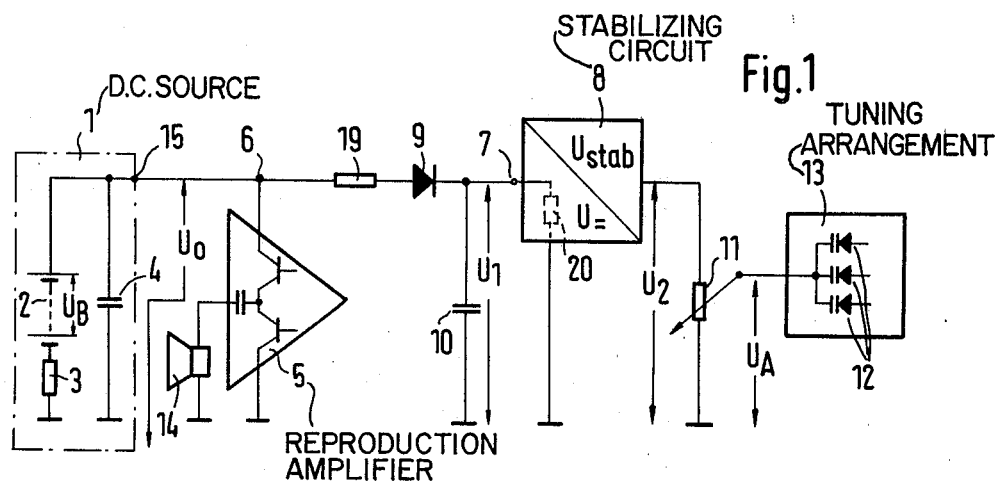
FIG. 1 shows the block diagram of part of a tunable receiver employing a D.C. supply source, a receiver part and a playback amplifier.

In FIG. 1, part of a tunable receiver, such as a portable radio receiver, is schematically shown by way of a block diagram. The receiver is supplied from a D.C. supply source 1 consisting of a battery 2 with resistor 3 schematically shown to be arranged in series with the battery, and of a capacitor 4 shown to be arranged in parallel with the battery. A playback (reproduction) amplifier 5 is connected via its supply terminal 6, directly to the D.C. supply source 1. The input 7 of the stabilizing circuit 8 is connected via a blocking diode 9, likewise to the D.C. supply source 1. Parallel in relation to the input 7 of the stabilizing circuit 8, there is arranged a capacitor 10. The stabilizing circuit 8, from the input voltage $U_1$ as applied to its input 7, produces at its output a stabilized tuning supply voltage $U_2$ which is applied to a tuning potentiometer 11 connected to the output of the stabilizing circuit 8. A tuning voltage $U_A$ for the varactor diodes 12 of the oscillating circuits of a tuning arrangement 13 of the receiver, may be taken off the tuning potentiometer 11.

The playback amplifier 5 takes from the D.C. supply source 1 an operating current whose amplitude is dependent upon the degree of modulation of the playback amplifier serving the connected loudspeaker 14, and which becomes greater as the modulation increases. This current causes a voltage drop across the internal resistor 3 of the battery 2, so that at the output terminals 15 of the D.C. supply source 1 there will appear an output voltage $U_0$ of the D.C. supply source 1 which is dependent upon the modulation of the playback amplifier 5 and indicated by the dashline characteristic 16 in the diagram of FIG. 2. This voltage, at the time positions $T_1$ and $T_2$ of high modulation peaks of the playback amplifier, drops below the voltage value $U_{10}$ which is indicated by the solid lines 10 in FIG. 2. Above this value $U_{10}$, the stabilizing circuit 8 produces a constant output voltage $U_2$ serving as the tuning supply voltage for the varactor diodes 12. Below this voltage value $U_{10}$, the output voltage of the stabilizing circuit drops off and almost follows the curve of the voltage at the input 7 of the stabilizing circuit, with this being schematically represented by the dotted curve 18 in the diagram of FIG. 2. The drops of the output voltage $U_2$ of the stabilizing circuit also causes a dropping of the adjusted tuning voltage $U_A$ which leads to a variation of the capacitance value of the varactor diodes 12 in the tuning arrangement 13 and, consequently, to a detuning of the oscillating circuits within the tuning arrangement 13.

Figure 2:
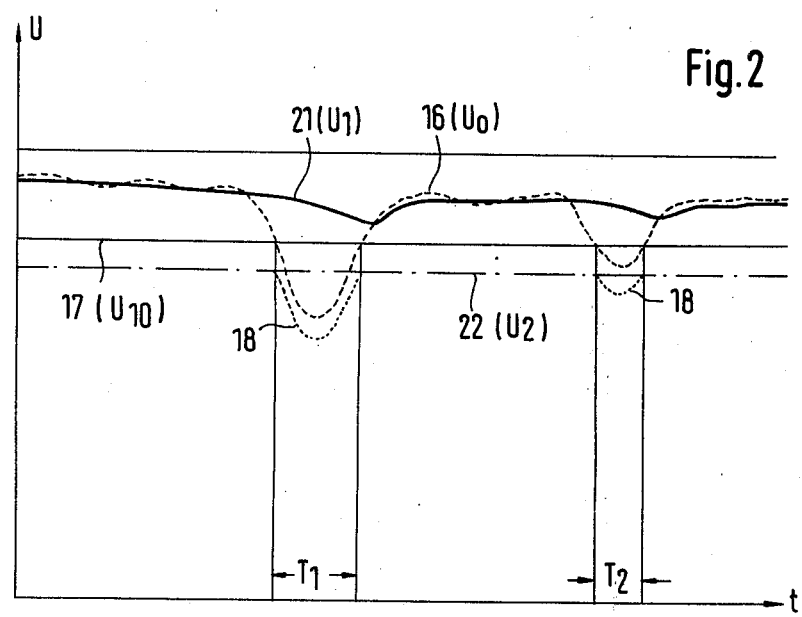
FIG. 2 shows a diagram with the voltage characteristics dependent upon one another, with respect to the circuit as shown in FIG. 1.

The capacitor 10 as lying in parallel with the input 7 of the stabilizing circuit 8, and which is charged across the low-ohmic protective resistor 19 and the blocking diode 9, is prevented from discharging across the internal resistor 3 of the battery 2, owing to the blocking diode, and can only discharge across the high-ohmic input resistor 20 of the stabilizing circuit 8. When the capacitor 10 is so dimensioned that the time constant of the discharging circuit for the capacitor 10 is greater than the normally longest period of time ($T_1$) of a modulation peak producing a voltage drop, for example, that of the half wave of the lowest nonattenuated, transmitted frequency, then the voltage $U_1$ at the capacitor 10, which is indicated by the curve 21 in FIG. 2, does not or does no longer drop substantially below the voltage value $U_{10}$, below which the stabilizing circuit 8 looses its stabilizing effect. The tuning supply voltage $U_2$ is thus maintained with its original amplitude, as is indicated in FIG. 2 by the dot-and-dashline 22, so that no detuning is caused.

Owing to the insertion of both the storage capacitor 10 and the blocking diode 9 it becomes possible to use the batteries 2 supplying the receiver with current, until the point of lowest discharge has been reached, without causing any noticeable detuning of the receiver although the resistance value of the internal resistor 3 of the batteries substantially increases with an increased operating time and causes greater voltage changes in the case of high modulation peaks of the playback amplifier 5.

I claim:

1. A tunable radio receiver comprising a D.C. power supply source, a reproduction amplifier having a power supply terminal connected to the D.C. power supply source, and a stabilizing circuit for generating a stabilized tuning supply voltage for varactor diodes used as tuning elements in a voltage-controlled tuning arrangement in the receiver, further comprising a blocking diode having its anode terminal coupled to said power supply terminal and its cathode terminal coupled to said stabilizing circuit and a capacitor parallel-coupled between said cathode terminal and a reference potential terminal, wherein said stabilizing circuit has an input resistance and the time constant of said capacitor and input resistance, is greater than the time duration ($T_1$) of voltage changes at the supply terminal caused by reproduction variations in said reproduction amplifier.

2. A receiver as claimed in claim 1, further comprising a protective resistor coupled in series with said amode terminal of said blocking diode.

* * * * *